US009799756B1

(12) United States Patent
Chan et al.

(10) Patent No.: US 9,799,756 B1
(45) Date of Patent: Oct. 24, 2017

(54) GERMANIUM LATERAL BIPOLAR TRANSISTOR WITH SILICON PASSIVATION

(71) Applicant: International Business Machines Corporation, Armonk, NY (US)

(72) Inventors: Kevin K. Chan, Staten Island, NY (US); Tak H. Ning, Yorktown Heights, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/229,378

(22) Filed: Aug. 5, 2016

(51) Int. Cl.
| | |
|---|---|
| *H01L 29/08* | (2006.01) |
| *H01L 29/737* | (2006.01) |
| *H01L 29/06* | (2006.01) |
| *H01L 29/10* | (2006.01) |
| *H01L 29/66* | (2006.01) |
| *H01L 27/12* | (2006.01) |
| *H01L 21/265* | (2006.01) |

(52) U.S. Cl.
CPC ......... *H01L 29/737* (2013.01); *H01L 21/265* (2013.01); *H01L 27/1203* (2013.01); *H01L 29/0642* (2013.01); *H01L 29/0808* (2013.01); *H01L 29/0821* (2013.01); *H01L 29/1008* (2013.01); *H01L 29/66242* (2013.01)

(58) Field of Classification Search
CPC ............... H01L 29/737; H01L 29/0642; H01L 29/0808; H01L 21/265; H01L 29/1008; H01L 29/66242; H01L 27/1203; H01L 29/0821
See application file for complete search history.

(56) References Cited

U.S. PATENT DOCUMENTS

| 6,765,227 | B1 * | 7/2004 | Yu ..................... H01L 21/76256 257/19 |
| 7,005,333 | B2 * | 2/2006 | Li ..................... H01L 21/28194 257/369 |
| 7,960,645 | B2 | 6/2011 | Posthuma et al. |
| 8,288,758 | B2 | 10/2012 | Ning et al. |
| 8,441,084 | B2 | 5/2013 | Cai et al. |
| 8,558,282 | B1 | 10/2013 | Cai et al. |
| 8,586,441 | B1 | 11/2013 | Cai et al. |
| 2003/0146473 | A1 * | 8/2003 | Inoue .................. H01L 29/1054 257/346 |
| 2006/0043530 | A1 * | 3/2006 | Ho ......................... H01L 21/84 257/565 |

OTHER PUBLICATIONS

Cai, et al., ",SOI lateral bipolar transistor with drive current> 3mA/μm", IEEE SOI-3D-Subthreshold Microelectronics Technology Unified Conference (S3S), pp. 1-2 (2013).
(Continued)

*Primary Examiner* — David Vu
(74) *Attorney, Agent, or Firm* — Cantor Colburn LLP; Vazken Alexanian

(57) ABSTRACT

Semiconductor structure including germanium-on-insulator lateral bipolar junction transistors and methods of fabricating the same generally include formation of a silicon passivation layer at an interface between the insulator layer and a germanium layer.

10 Claims, 4 Drawing Sheets

(56) References Cited

OTHER PUBLICATIONS

Ning, Tak H., "On the Performance and Scaling of Symmetric Lateral Biploar Transistors on SOI," IEEE. J. Electron Devices Society, 1(1), pp. 21-27 (2013).

Romanjek, et al., "Improved GeOI substrates for pMOSFET off-state leakage control", Microelectronic Engineering, 86 (7), pp. 1585-1588 (2009).

Yau, et al., "SiGe-on-Insulator Symmetric Lateral Bipolar Transistors," IEEE SOI-3D-Subthreshold Microelectronics Technology Unified Conference (S3S), pp. 1-2 (2015).

* cited by examiner

GERMANIUM LATERAL BIPOLAR TRANSISTOR WITH SILICON PASSIVATION

BACKGROUND

The present disclosure relates to a lateral bipolar junction transistor (BJT) structure, and particularly to a germanium lateral bipolar junction transistor and methods of manufacturing the same.

Germanium-on-insulator (GeOI) lateral bipolar transistors have been demonstrated to achieve the same drive current as similar devices built on silicon/germanium on insulator (SiGeOI) and silicon on insulator (SOI) substrates at >400 mV lower of operation voltage, implying potential benefit in power-efficient applications. However, the current gain is limited by the excessive base current as compared to the SiGeOI and SOI devices. Analysis indicates the less-than-ideal base current in GeOI lateral bipolar transistors is likely due to the defects at the Ge/BOX interface. GeOI wafers with good passivation of the Ge/BOX interface is then required to fully utilize the benefit of GeOI bipolar transistor.

SUMMARY

Disclosed herein are semiconductor structures including a lateral bipolar junction transistor and methods forming the semiconductor structure.

In one or more embodiments, a semiconductor structure including a bipolar junction transistor includes a first silicon passivation layer on an insulator layer including a first silicon base region, a first silicon emitter region in contact with the first silicon base region, and a first silicon collector region in contact with the first silicon base region, wherein the first silicon base region includes dopants of a first conductivity type, said the first silicon collector and emitter regions include dopants having an opposite sign to the first conductivity. A germanium layer overlies and is in contact with the first silicon passivation layer, the germanium layer including a germanium base region including dopants of the first conductivity type, and germanium collector and emitter regions in contact with the germanium base region comprising dopants having the opposite sign to the first conductivity. An extrinsic base region includes dopants of the first conductivity type in contact with the germanium base region.

In one or more embodiments, a method of forming a semiconductor structure including lateral bipolar junction transistors in parallel includes bonding a first substrate including a germanium layer, a first silicon passivation layer, and a first oxide layer to a second substrate including a second oxide layer to form a vertical stack of an insulator layer, the first silicon passivation layer on the insulator layer, and the germanium layer on the silicon passivation layer, wherein the insulator layer is formed by and defined by an oxide-to-oxide bonding of the first oxide layer to the second oxide layer, and wherein the germanium layer and the first silicon passivation layer have a doping of the first conductivity type. An extrinsic base region having a doping of the first conductivity type is formed on the germanium layer. Regions having a doping of a second conductivity type that is of an opposite sign to that of the first conductivity type are formed in the germanium layer and in the first silicon passivation layer, wherein a germanium emitter region and a germanium collector region having the second conductivity type are formed in the germanium layer, and a silicon emitter region and a silicon collector region having the second conductivity type are formed in the first silicon passivation layer. Intrinsic base regions of the first conductivity type are formed therebetween.

In one or more embodiments, the semiconductor structure includes a bipolar junction transistor including a first silicon passivation layer on an insulator layer including a silicon base region, a silicon emitter region in contact with said silicon base region, and a silicon collector region in contact with said silicon base region, wherein the silicon base region comprises dopants of a first conductivity type, the silicon collector and emitter regions comprise dopants having an opposite sign to the dopants of the first conductivity; a germanium layer overlying and in contact with the first silicon passivation layer, the germanium layer including a germanium base region comprising dopants of the first conductivity type, germanium collector and emitter regions in contact with said germanium base region and comprising dopants having the opposite sign to the dopants of the first conductivity; a second silicon passivation layer on the germanium layer including a second silicon base region, a second silicon emitter region in contact with the second silicon base region, and a second silicon collector region in contact with the second silicon base region, wherein the second silicon base region comprises dopants of a first conductivity type, and the silicon collector and emitter regions comprise dopants having an opposite sign to the dopants of the first conductivity; and an extrinsic base region in contact with the second silicon base region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

DETAILED DESCRIPTION

Figure 1:
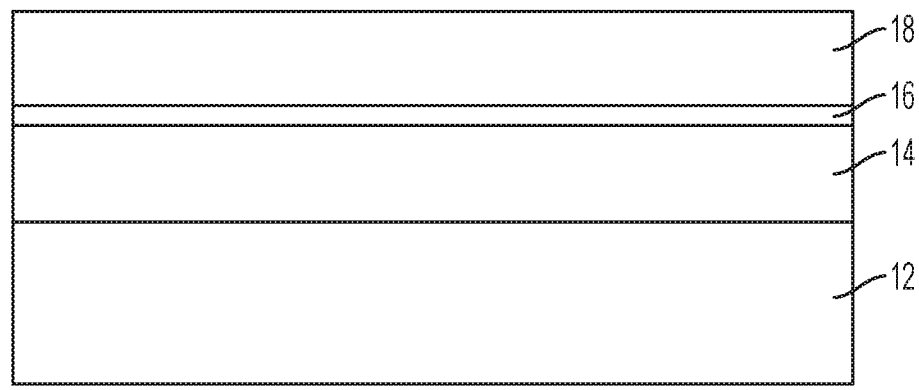
FIG. 1 is a vertical cross-sectional view of a germanium-on-insulator (GeOI) substrate including a silicon passivation layer at an interface between a germanium layer and a buried insulator layer thereupon according to one or more embodiments of the present invention.

As stated above, the present invention generally relates to a germanium lateral bipolar junction transistors and methods of manufacturing the same, which are now described in detail with accompanying figures. It is noted that like and corresponding elements mentioned herein and illustrated in the drawings are referred to by like reference numerals.

Referring to FIG. 1, a germanium-on-insulator (GeOI) substrate 10 is shown, which can be utilized to form a semiconductor structure including bipolar junction transistors. The GeOI substrate 10 includes a stack, from bottom to top, of a handle substrate 12, a buried insulator layer 14 contacting a top surface of the handle substrate 12, a first silicon passivation layer 16 contacting a top surface of the buried insulator surface, and a germanium layer 18 contacting the top surface of the silicon passivation layer 16. The germanium layer 18 as provided can include a single crystalline germanium material that extends across the entirety of the passivation layer 16. As will be described in greater detail below, the first silicon passivation layer 16 is formed on the "bottom" surface of the germanium layer 18 during fabrication of the semiconductor structure, wherein the silicon passivation layer 16 reduces interface defects between the germanium layer 18 and the buried insulator layer 14.

The handle substrate 12 can include a semiconductor material, an insulator material, a conductor material, or a combination thereof. In one example, the handle substrate 12 can include a semiconductor material such as silicon. If the handle substrate 12 includes a semiconductor material, the handle substrate 12 can be undoped or have a p-type doping or an n-type doping.

The buried insulator layer 14 includes a dielectric material such as silicon oxide and/or silicon nitride. For example, the buried insulator layer 14 can include thermal silicon oxide. The thickness of the buried insulator layer 14 can be from 5 nanometers (nm) to 1000 nm, and typically from 100 nm to 200 nm, although lesser and greater thicknesses can also be employed. The buried insulator layer 14 may, or may not, include multiple dielectric layers, e.g., a stack including at least a silicon oxide layer and a silicon nitride layer.

The germanium layer 18 as provided in the GeOI substrate can be a planar semiconductor material layer having a first thickness. The first thickness can be, for example, from 5 nm to 1,000 nm, although lesser and greater thicknesses can also be employed. The germanium layer 18 is a single crystalline germanium layer and can be doped with electrical dopants, which can be p-type dopants or n-type dopants. N-type doped semiconductors have a larger electron concentration than hole concentration whereas p-type doped semiconductors have a larger hole concentration than electron concentration. In other words, p type semiconductors and n-type semiconductors have opposite signs. The germanium layer 18 can consist essentially of germanium and the dopants.

If the germanium is to be p-type, the electrical dopants in the germanium layer 18 can be, for example, B, Al, Ga, In, and/or Tl. If the germanium type is n-type, the electrical dopants can be, for example, P, As, and/or Sb. The dopant concentration in the germanium layer 18 can be from $1.0 \times 10^{15}/cm^3$ to $3.0 \times 10^{19}/cm^3$, although lesser and greater dopant concentrations can also be employed.

The silicon passivation layer 16 is provided on the bottom surface of the germanium layer, i.e., at an interface between the germanium layer 18 and the buried insulator layer 14 such that the silicon passivation layer 16 is in direct contact with the insulator layer 14. The silicon passivation layer 16 can include crystalline silicon and optionally dopants of the same conductivity type as in germanium layer 18.

Silicon passivation layer 16 passivates the bottom surface of the germanium layer 18, thereby reducing interfacial defects between the buried insulator layer and the germanium layer. The silicon passivation layer 16 can be formed by chemical vapor deposition (CVD), vacuum evaporation, molecular beam deposition, atomic layer deposition (ALD), and/or physical vapor deposition (PVD). By way of example, the silicon passivation layer can be deposited using ultrahigh vacuum chemical vapor deposition. The silicon passivation layer 16 conformally covers the entirety of the respective surface of the germanium layer 18. The thickness of the silicon passivation layers 16 is selected so as to enable complete coverage of the surface of the germanium layer 18. Due to the lattice mismatch between the germanium lattice constant and the silicon lattice constant, the silicon passivation layers 16 cannot be deposited with epitaxial alignment to the germanium layer 18, and is deposited in Stranski-Krastanov growth mode. Thus, the thickness of the silicon passivation layers 16 is herein referred to as a second thickness, and is generally greater than 1 monolayer of silicon. In one embodiment, the second thickness of the silicon passivation layer 16 can be from 1 nm to 20 nm, although lesser and greater thicknesses can also be employed. In one or more embodiments, the silicon passivation layer 16 has a thickness less than 5 nm.

The silicon passivation layer 16 can be in-situ doped or ex-situ doped (for example, by ion implantation after deposition of an intrinsic silicon material) with dopants. The concentration of dopants in the silicon passivation layer 16 can be comparable to the concentration of the dopants in the germanium layer 18. Alternately, the silicon passivation layer 16 can be deposited as an intrinsic layer, which can be subsequently doped during a thermal anneal to be doped with some of the dopants in the germanium layer 18.

Figure 2:
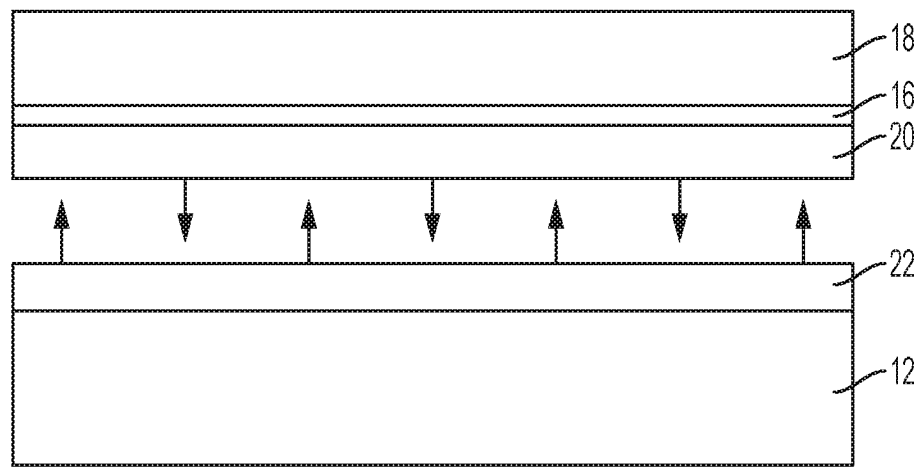
FIG. 2 is a vertical cross-sectional view illustrating the formation of the GeOI substrate of FIG. 1 prior to oxide-to-oxide bonding according to one or more embodiments of the present invention.
Figure 3:
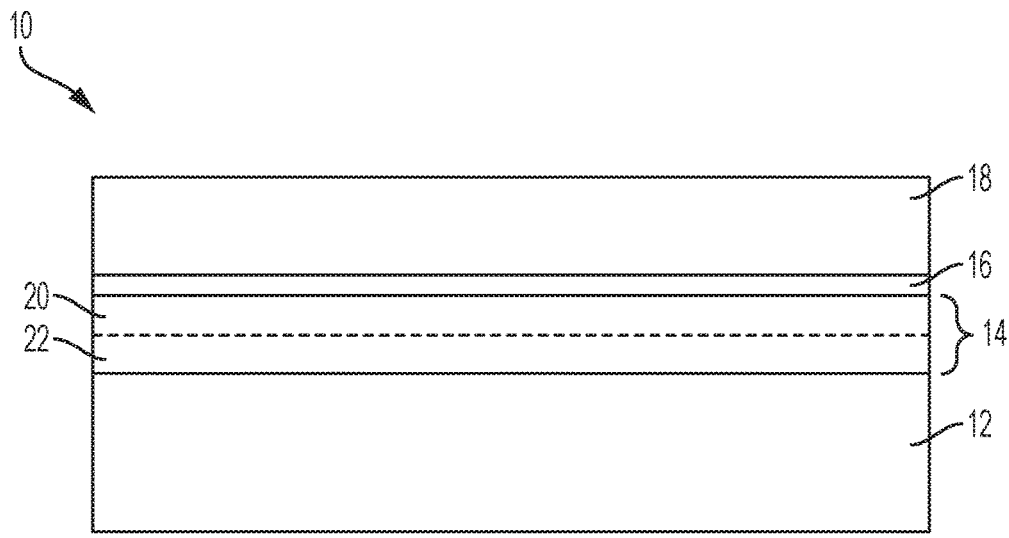
FIG. 3 is a vertical cross-sectional view illustrating the formation of the GeOI substrate of FIG. 1 subsequent to oxide-to-oxide bonding according to one or more embodiments of the present invention.

Referring now to FIGS. 2-3, a process for forming the GeOI substrate 10 of FIG. 1 that can be used to form a semiconductor structure such as a lateral bipolar junction transistor, for example, generally includes bonding a germanium wafer 18 to a handle substrate 12, wherein the respective bonded surfaces include oxide layers deposited thereon or thermally grown oxides. Prior to bonding the germanium wafer 18 to the handle substrate 12, the germanium wafer 18 is first processed by epitaxially depositing a relatively thin silicon passivation 16 layer onto a surface of the germanium wafer to be bonded. An oxide layer 20 is then deposited onto the silicon passivation layer 16. The oxide layer 20, e. g., silicon dioxide, is at a thickness representing a fraction of the thickness of the buried insulator layer 14.

On the handle substrate 12, an oxide layer 22, e. g., silicon dioxide, is thermally grown or deposited thereon and also represents a fraction of the thickness of the buried insulator layer 14. As previously noted, the handle substrate 12 can include a semiconductor material, an insulator material, a conductor material, or a combination thereof. In one example, the handle substrate 12 can include a semiconductor material such as silicon. If the handle substrate 12 includes a semiconductor material, the handle substrate 12 can be undoped or have a p-type doping or an n-type doping.

The germanium wafer 18 is then flipped and oriented such that the oxide layer 20 thereon is bonded to the oxide layer 22 of the handle substrate, wherein the oxide layers 22, 24 collectively define the buried insulator layer 14 as shown in FIG. 3. For example, the deposited oxide layer 20 on the germanium wafer 18 and the deposited or thermally grown oxide layer 24 on the handle substrate 12 can be at a thickness of 100 nm each, thereby forming the buried insulator layer 14 with a thickness of 200 nm. Bonding can be effected by annealing at an elevated temperature in an amount effective to enhance oxide-to-oxide bonding. By way of example, annealing of a silicon oxide layer on one substrate to another silicon oxide layer on another substrate can be at a temperature of 400 to 600° C. for a period of 15 to 60 minutes. The germanium layer can then be optionally thinned, if desired, to a desired thickness intended for device fabrication.

Figure 4:
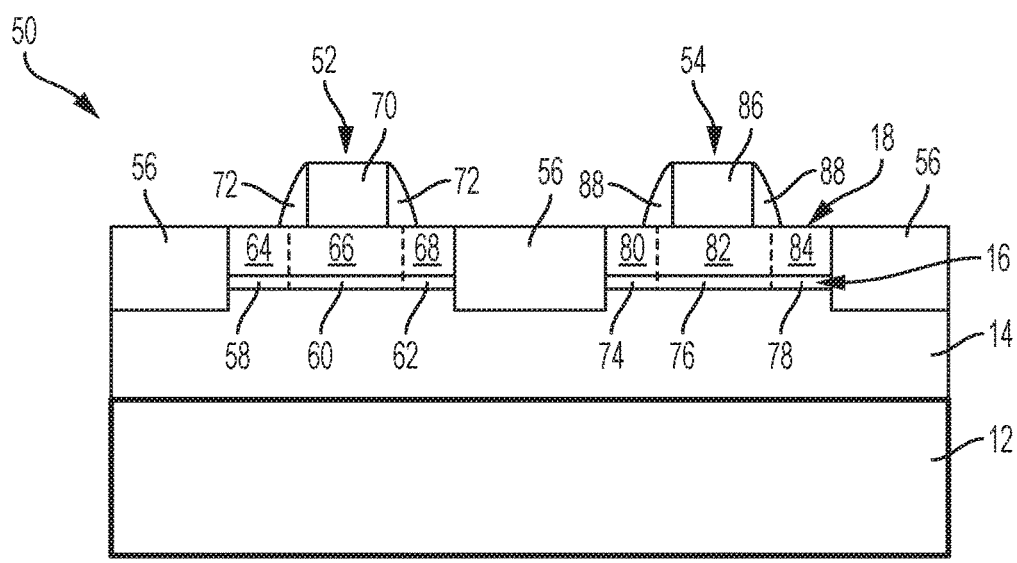
FIG. 4 is a vertical cross-sectional view of an exemplary semiconductor structure including lateral bipolar junction transistors formed from the GeOI substrate of FIG. 1 including a silicon passivation layer at an interface between a germanium layer and a buried insulator layer according to one or more embodiments of the present invention.

Referring now to FIG. 4, an exemplary semiconductor structure 50 is shown including lateral bipolar junction transistors formed from the GeOI substrate 10. The lateral bipolar junction transistors in the one or more embodiments described herein can be formed using standard processing techniques such as is disclosed in U.S. Pat. No. 8,586,441, which is incorporated by reference in its entirety for the one or more embodiments described herein. The illustrated semiconductor structure 50 includes both NPN and PNP transistor devices 52, 54, respectively formed with the GeOI substrate 10, which, as previously described, includes a stack including a handle substrate 12, a buried insulator layer 14, a silicon passivation layer 16, and the germanium layer 18. The illustrated NPN and PNP devices 52, 54, are separated by shallow trench isolation regions 56 formed of a dielectric material. Exemplary dielectric materials include, but are not intended to be limited to, silicon oxide, silicon nitride, and/or silicon oxynitride. The dielectric material can be deposited, for example, by chemical vapor deposition (CVD). The bottom surface of the shallow trench isolation regions can be formed coplanar to or just below the surface of the buried insulator layer 14. Likewise, the top surface of the shallow trench isolation regions 56 can be coplanar with, raised above, or recessed below, the top surface of the germanium layer 18 within the stack.

Referring now to NPN device 52, there is shown two lateral NPN bipolar junction transistors formed in parallel. In the silicon passivation layer 16, an n-type silicon emitter region 58, a p-type silicon base region 60, and an n-type silicon collector region 62 are formed. In the germanium layer 18, an n-type germanium emitter region 64, a p-type germanium base region 66, and an n-type germanium collector region 68 are formed. As a result, the p-type silicon base region 60 is on the buried insulator layer 14 and the p-type germanium 66 on top of the p-type silicon base region 60. Given that the band gap of 0.66 electron volts (eV) for germanium is smaller than the band gap of 1.12 eV of silicon, device characteristics are determined by the germanium NPN. The emitter and collector regions can be crystalline, polycrystalline, or amorphous and the intrinsic base regions are crystalline.

The NPN device 52 further includes an extrinsic base 70 formed on the germanium layer 18. The extrinsic base 70 is p-type and can be a doped semiconductor material layer having a doping of the same type as the germanium base region 66. In one embodiment, the extrinsic base 70 includes a different semiconductor material than the silicon passivation layer 16. In another embodiment, the extrinsic base 70 includes the same semiconductor material as the silicon passivation layer 16. In one or more embodiments, the extrinsic base 70 can be crystalline, polycrystalline, or amorphous.

The extrinsic base 70 can be in-situ doped during deposition, or can be deposited as an intrinsic semiconductor material layer and subsequently doped by ion implantation, gas phase doping, plasma doping, or diffusion of electrical dopants from a disposable dopant source layer (such as a borosilicate glass layer glass layer). For example, the extrinsic base 70 can include dopants at a dopant concentration from $1.0 \times 10^{18}/cm^3$ to $3.0 \times 10^{21}/cm^3$, although lesser and greater dopant concentrations can also be employed. In one embodiment, the extrinsic base 70 can include a doped polycrystalline material. The extrinsic base layer 70 can be deposited, for example, by chemical vapor deposition (CVD) or physical vapor deposition (PVD). The thickness of the extrinsic base layer 70 can be from 10 nm to 1,000 nm, although lesser and greater thicknesses can also be employed.

The extrinsic base 70 may include a base cap (not shown), which can include a dielectric material such as silicon oxide, silicon nitride, silicon oxynitride, a dielectric metal oxide, or a combination thereof. The base cap can be deposited, for example, by chemical vapor deposition (CVD). The thickness of the base cap can be from 10 nm to 1,000 nm, although lesser and greater thicknesses can also be employed. In one embodiment, a dielectric material different from the dielectric materials of the shallow trench isolation structure 56 is employed for the base cap so that the material of the base cap can be subsequently removed selective to the material of the shallow trench isolation structure as may be desired for some applications.

A dielectric spacer 72 can be formed on sidewalls of the extrinsic base 70 and on portions of the top surface of the germanium layer 18 that are proximal to the sidewalls of the extrinsic base 70. The dielectric spacer 72 includes a dielectric material such as silicon oxide, silicon nitride, silicon oxynitride, organosilicate glass, or any dielectric material that can be employed to form a spacer as known in the art. In one or more embodiments, the material of the dielectric spacer 72 is selected to be different from the dielectric material of the base cap so that the material of the base cap can be subsequently removed selective to the material of the dielectric spacer 72 as may be desired for some applications.

Referring now to the PNP device 54, there is shown two lateral PNP bipolar junction transistors formed in parallel. In the silicon passivation layer 16, a p-type silicon emitter region 74, an n-type silicon base region 76, and a p-type silicon collector region 78 are formed. In the germanium layer 18, a p-type germanium emitter region 80, an n-type germanium base region 82, and a p-type germanium collector region 84 are formed. As a result, the n-type silicon base region 76 is directly on the buried insulator layer 14 and the n-type germanium 82 is on top of the n-type silicon base region 76. Again, given the differences in band gap energy between germanium and silicon, the devices characteristics will be determined completely by the germanium PNP.

The PNP device 54 further includes an extrinsic base 86 formed on the germanium layer 18. The extrinsic base 86 can be a doped semiconductor material layer having a doping of the same type as the germanium base region 82. In one or more embodiments, the extrinsic base 86 includes a different semiconductor material than the silicon passivation layer 16. In another embodiment, the extrinsic base 86 includes the same semiconductor material as the silicon passivation layer 16. In one embodiment, the extrinsic base 86 can be polycrystalline or amorphous as deposited.

The extrinsic base 86 can be in-situ doped during deposition, or can be deposited as an intrinsic semiconductor material layer and subsequently doped by ion implantation, gas phase doping, plasma doping, or diffusion of electrical dopants from a disposable dopant source layer (such as a phosphosilicate glass layer or an arsenosilicate glass layer). For example, the extrinsic base 86 includes dopants at a dopant concentration from $1.0 \times 10^{18}/cm^3$ to $3.0 \times 10^{21}/cm^3$, although lesser and greater dopant concentrations can also be employed. In one embodiment, the extrinsic base 86 can include a doped polycrystalline material. The extrinsic base layer 86 can be deposited, for example, by chemical vapor deposition (CVD) or physical vapor deposition (PVD). The thickness of the extrinsic base layer 86 can be from 10 nm to 1,000 nm, although lesser and greater thicknesses can also be employed.

The extrinsic base 86 may include a base cap (not shown), which can include a dielectric material such as silicon oxide, silicon nitride, silicon oxynitride, a dielectric metal oxide, or a combination thereof. The base cap can be deposited, for example, by chemical vapor deposition (CVD). The thickness of the base cap can be from 10 nm to 1,000 nm, although lesser and greater thicknesses can also be employed. In one embodiment, a dielectric material different from the dielectric materials of the shallow trench isolation structure 56 is employed for the base cap so that the material of the base cap can be subsequently removed selective to the material of the shallow trench isolation structure as may be desired for some applications.

A dielectric spacer 88 can be formed on sidewalls of the extrinsic base 86 and on portions of the top surface of the germanium layer 18 that are proximal to the sidewalls of the extrinsic base 88. The dielectric spacer 88 includes a dielectric material such as silicon oxide, silicon nitride, silicon oxynitride, organosilicate glass, or any dielectric material that can be employed to form a spacer as known in the art. In one or more embodiments, the material of the dielectric spacer 88 can be selected to be different from the dielectric material of the base cap so that the material of the base cap can be subsequently removed selective to the material of the dielectric spacer 88 as may be desired for some applications.

Accordingly, the resulting GeOI lateral bipolar junction 50 transistors include a silicon passivation layer at the interfaces of germanium and the buried insulator layer, which advantageously reduces interface defects during manufacture thereof.

Figure 5:
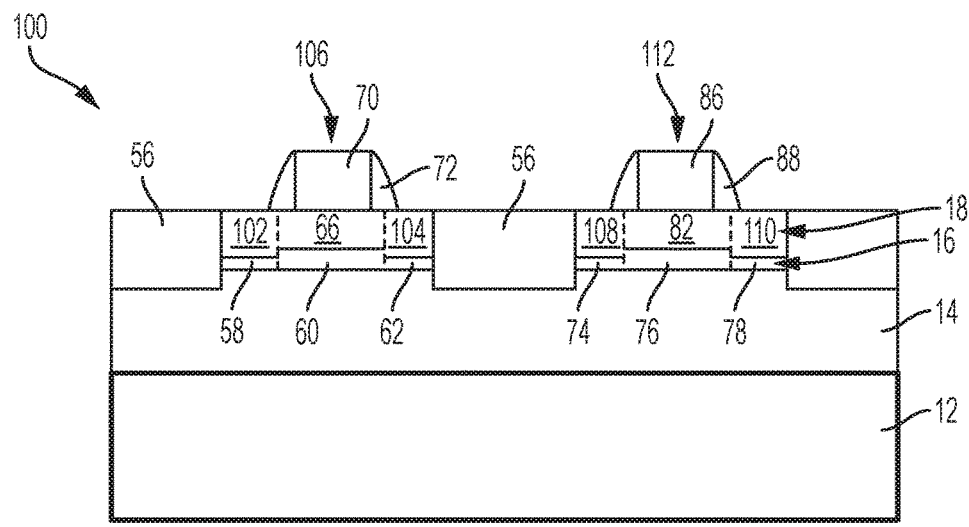
FIG. 5 is a vertical cross-sectional view of an exemplary semiconductor structure including lateral bipolar junction transistors formed from the GeOI substrate of FIG. 1 including wider bandgap materials in the emitter and collector regions according to one or more embodiments of the present invention.

Optionally, the emitter and collector regions of the NPN and PNP devices in the semiconductor structure are recessed by removal of germanium (e.g., emitter and collector regions 64, 68 and 80, 84 shown in FIG. 4). After removal of germanium in the emitter and collector regions, the exposed passivation silicon layer 16 in the emitter and collector regions may be doped n type for the NPN device and p type for the PNP device by ion implantation. The recessed emitter and collector regions of the NPN and PNP devices are then filled with epitaxially grown wider bandgap materials such as silicon, silicon-germanium, or the like. The wider bandgap materials for the emitter and collector regions can be doped in situ during epitaxial growth, or doped by ion implantation after epitaxial growth. An exemplary semiconductor structure 100 including the wider bandgap materials in the emitter and collector regions 102, 104, respectively, for NPN device 106 and the emitter and collector regions 108, 110 respectively, for PNP device 112 is shown in FIG. 5. The epitaxially grown wider bandgap materials advantageously reduce base current injection into the respective emitter and collector regions.

Referring now to NPN device 106, there is shown two lateral NPN bipolar junction transistors formed in parallel. In the silicon passivation layer 16, an n-type silicon emitter region 58, a p-type silicon base region 60, an n-type silicon collector region 62 are formed. In the germanium layer 18, an n-type wider bandgap emitter region 102, a p-type germanium base region 66, and an n-type wider bandgap collector region 104 are formed. Given that the band gap of 0.66 eV for germanium is smaller than the band gap of 1.12 eV for silicon, the device characteristics are determined by the NPN having germanium as the base.

Referring now to the PNP device 112, there is shown two lateral PNP bipolar junction transistors formed in parallel. In the silicon passivation layer 16, a p-type silicon emitter region 74, an n-type silicon base region 76, and a p-type silicon collector region 78 are formed. In the germanium layer 18, a p-type wider bandgap emitter region 108, an n-type germanium base region 82, and a p-type wider bandgap collector region 110 are formed. Again, given the difference in band gap energy between germanium and silicon, the device characteristics will be determined completely by the PNP having germanium as the base.

The emitter and collector regions of the wider bandgap materials formed on the silicon passivation layer 16 can be polysilicon or crystalline. By way of example, the NPN device can include n-type silicon or n-type silicon-germanium as the wider bandgap material in the emitter and collector regions 102, 104, wherein the extrinsic base 70 is p-type silicon, p-type germanium or p-type silicon-germanium as previously described. The silicon region 58 underlying the emitter region 102 and the silicon region 62 underlying the collector region 104 are n-type, and the silicon region 60 underlying the germanium region 66 is p-type. Likewise, the PNP device can include p-type silicon or p-type silicon-germanium as the wider bandgap material in the emitter and collector regions 108, 110, wherein the extrinsic base 86 is n-type silicon, n-type germanium or n-type silicon-germanium. The silicon region 74 underlying the emitter region 108, and the silicon region 78 underlying the collector region 110 are p-type, and the silicon region 76 underlying the germanium region 82 is n-type.

Figure 6:
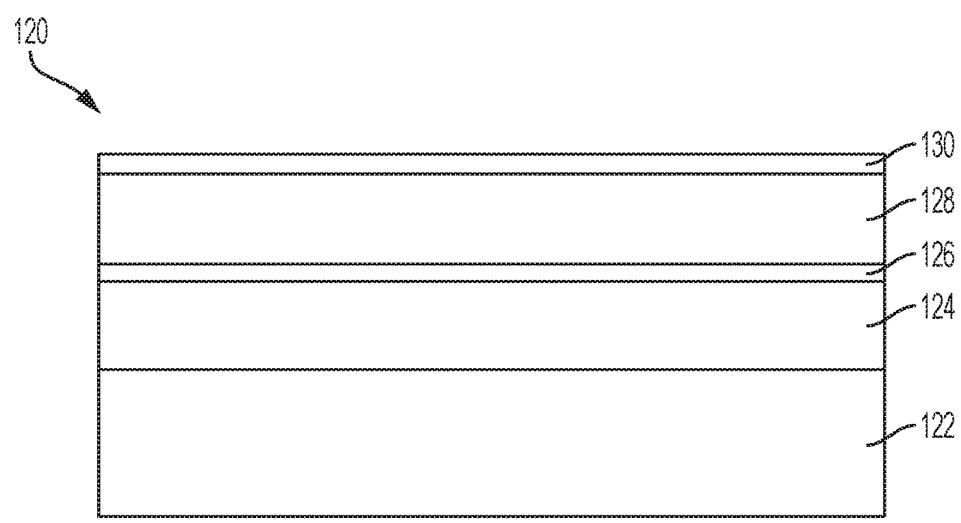
FIG. 6 is a vertical cross-sectional view of a GeOI substrate including a silicon passivation layer at an interface between a germanium layer and a buried insulator layer thereupon as well as the top surface of the germanium layer according to one or more embodiments of the present invention.

Turning now to FIG. 6, in one or more other embodiments, a semiconductor structure can be formed from GeOI substrate 120, which can include a stack, from bottom to top, of a handle substrate 122, a buried insulator layer 124 contacting a top surface of the handle substrate 122, a first silicon passivation layer 126 contacting a top surface of the buried insulator layer 124, a germanium layer 128 contacting the top surface of the silicon passivation layer 126, and a second silicon passivation layer 130 contacting a top surface of the germanium layer 128.

The GeOI substrate 120 and layers therein can generally be fabricated and have similar characteristics, materials, and thicknesses to the same named layers as previously described above. Subsequent to bonding the germanium wafer 128 to handle substrate 122 as discussed above, wherein the respective bonded surfaces include oxide layers deposited or thermally grown thereon that collectively form the buried insulator layer 124, a second silicon passivation layer 130 is deposited onto a top surface of the germanium layer 128. The second silicon passivation layer 130 prevents oxidation of the top surface of the germanium layer 128. As such, GeOI lateral bipolar junction transistors can be fabricated with silicon passivation layers 126, 130 on both the top surface of the germanium layer 128 and at the interface between germanium layer 128 and the buried insulator layer 124.

Similar to that of the first passivation layer 126, the second silicon passivation layer 130 can be epitaxially deposited at a similar thickness. The silicon passivation layers 126, 130 can include silicon and optionally dopants. The intrinsic base regions are crystalline.

Figure 7:
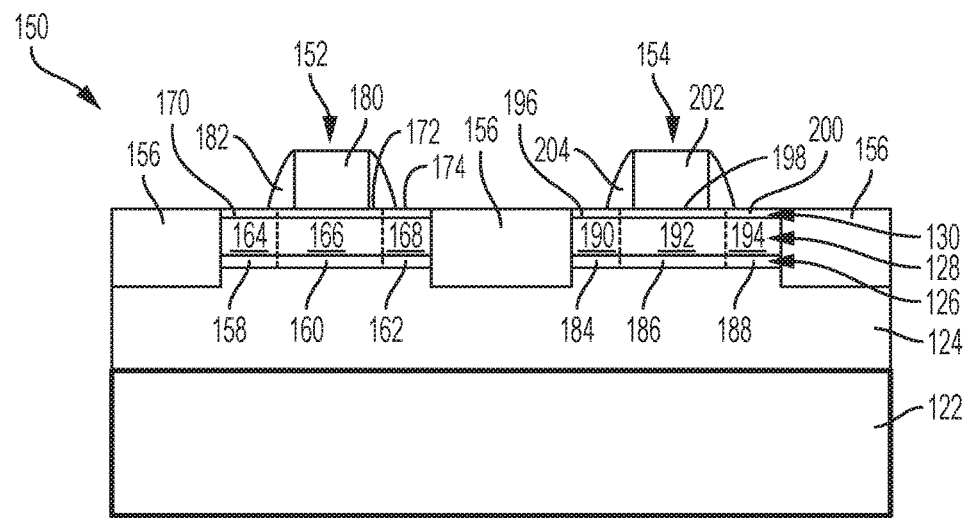
FIG. 7 an exemplary semiconductor structure including lateral bipolar junction transistors formed from the GeOI substrate of FIG. 6 according to one or more embodiments of the present invention.

Turning now to FIG. 7, there is depicted a vertical cross-sectional view of a semiconductor structure 150 including lateral bipolar junction transistors formed from the GeOI substrate 120 of FIG. 6 according to one or more embodiments of the present invention.

The illustrated bipolar junction transistors include both NPN and PNP transistor devices 152, 154, respectively formed with the GeOI substrate 120, which, as previously described, includes a stack including a handle substrate 122, a buried insulator layer 124, a first silicon passivation layer 126, a germanium layer 128, and a second silicon passivation layer 130. The illustrated NPN and PNP devices 152, 154, are separated by shallow trench isolation regions 156 formed of a dielectric material as previously described.

As shown, NPN device 152 includes three lateral NPN bipolar junction transistors formed in parallel. In first silicon passivation layer 126, an n-type silicon emitter region 158, a p-type silicon base region 160, and an n-type silicon collector region 162 are formed. In germanium layer 128, an n-type germanium emitter region 164, a p-type germanium base region 166, and an n-type germanium collector region 168 are formed. In second silicon passivation layer 130, an n-type silicon emitter region 170, a p-type silicon base region 172, and an n-type silicon collector region 174 are formed. As a result, the p-type silicon base region 160 is on the buried insulator layer 124, the p-type germanium 166 is on top of the first p-type silicon base region 160, and the second p-type silicon base region 172 is on top of the p-type germanium 166. Device characteristics are determined by the germanium bipolar junction transistor due to its relatively smaller bandgap compared to the silicon bipolar junction transistors.

The NPN device 152 further includes an extrinsic base 180 formed on the second silicon passivation layer 130. The extrinsic base 180 can be a doped semiconductor material layer having a doping of the same type as the base regions 172, 166 and 160.

The extrinsic base 180 may include a base cap (not shown) as previously described in prior embodiments, which can include a dielectric material such as silicon oxide, silicon nitride, silicon oxynitride, a dielectric metal oxide, or a combination thereof.

A dielectric spacer 182 can be formed on sidewalls of the extrinsic base 180 and on portions of the top surface of the second silicon passivation layer 130 that are proximal to the sidewalls of the extrinsic base 180. The dielectric spacers can be the same as that described in prior embodiments.

Referring now to the PNP device 154, there is shown three lateral PNP bipolar junction transistors formed in parallel. In the first silicon passivation layer 126, a p-type silicon emitter region 184, an n-type silicon base region 186, and a p-type silicon collector region 188 are formed. In the germanium layer 128, a p-type germanium emitter region 190, an n-type germanium base region 192, and a p-type germanium collector region 194 are formed. In the second silicon passivation layer 130, a p-type silicon emitter region 196, an n-type silicon base region 198, and a p-type silicon collector region 200 are formed. As a result, the germanium 192 is sandwiched between the first and second silicon regions 186, 198, respectively. Again, given the differences in band gap energy between germanium and silicon, the device characteristics will be governed by the germanium PNP transistor.

The PNP device 154 further includes an extrinsic base 202 formed on the n-type silicon base region 198. Similar to previous embodiments, the extrinsic base 202 can be a doped semiconductor material layer having a doping of the same type as the base regions 186, 192 and 198. In one or more embodiments, the extrinsic base 202 includes a different semiconductor material than the first and/or second silicon passivation layers 126, 130. In another embodiment, the extrinsic base 202 includes the same semiconductor material as the first and/or second silicon passivation layers 126, 130. In one or more embodiments, the extrinsic base 202 can be can be crystalline, polycrystalline, or amorphous. By way of example, the extrinsic base 202 in the PNP device 154 is an n-type silicon, n-type germanium or n-type silicon-germanium. The thickness of the extrinsic base layer 202 can be from 10 nm to 1,000 nm, although lesser and greater thicknesses can also be employed.

The extrinsic base 202 may include a base cap (not shown), which can include a dielectric material such as silicon oxide, silicon nitride, silicon oxynitride, a dielectric metal oxide, or a combination thereof. A dielectric spacer 204 can be formed on sidewalls of the extrinsic base 202 and on portions of the top surface of the second silicon passivation layer 130 that are proximal to the sidewalls of the extrinsic base 202.

Accordingly, the resulting GeOI lateral bipolar junction transistors, including both the NPN and PNP devices, include silicon passivation layers at the interfaces of germanium layer and the buried insulator layer as well as on the top surface of the germanium layer, which advantageously reduces interface defects as well as prevents oxidation of the germanium layer.

Figure 8:
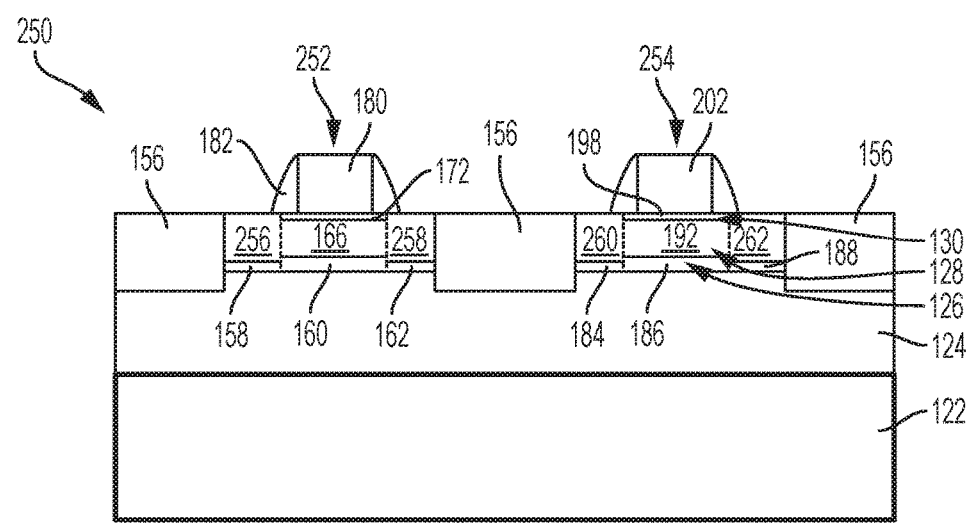
FIG. 8 an exemplary semiconductor structure including lateral bipolar junction transistors formed from the GeOI substrate of FIG. 6 with wider bandgap materials in the emitter and collector regions according to one or more embodiments of the present invention.

Turning now to FIG. 8, there is depicted a vertical cross-sectional view of semiconductor structure 250 including lateral bipolar junction transistors formed from the GeOI substrate 120 of FIG. 6 including wider bandgap materials as previously described in the emitter and collector regions according to one or more embodiments of the present invention. The illustrated semiconductor structure 250 includes both NPN and PNP devices 252, 254, respectively formed from the GeOI substrate 120 as previously described in relation to the semiconductor structure of FIG. 7 except the emitter and collector regions in the different devices are recessed by removal of the second silicon passivation layer, the germanium layer and a portion of the first passivation layer therein. The exposed first passivation layer in the recessed emitter and collector regions may be doped n type for the NPN device and p type for the PNP device by ion implantation. The recessed emitter and collector regions of the NPN and PNP devices are then filled with epitaxially grown wider bandgap materials such as doped silicon, doped silicon-germanium, or the like.

Referring now to NPN device 252, there is shown two lateral NPN bipolar junction transistors formed in parallel. In the first silicon passivation layer 126, an n-type silicon emitter region 158, a p-type silicon base region 160, and an n-type silicon collector region 162 are formed. In the germanium layer 128, an n-type wider bandgap emitter region 256, a p-type germanium base region 166, and an n-type wider bandgap collector region 258 are formed. Again, the characteristics of NPN device 252 are determined by the parallel NPN transistor having germanium base region. By way of example, the NPN device can include n-type silicon or n-type silicon-germanium as the wider bandgap material in the emitter and collector regions 256, 258 as shown, wherein the extrinsic base 180 is p-type silicon, p-type germanium or p-type silicon-germanium as previously described. The first silicon passivation region 160 and the second silicon passivation region 172 can be p type silicon, and the germanium region 166 can be p type germanium. Similarly, referring to PNP device 254, there is shown two lateral PNP bipolar junction transistors formed in parallel. In the first silicon passivation layer 126, a p-type silicon emitter region 184, an n-type silicon base region 186, and a p-type silicon collector region 188 are formed. In the germanium layer 128, a p-type wider bandgap emitter region 260, an n-type germanium base region 192, and a p-type wider bandgap collector region 262 are formed. The PNP device can include p-type silicon or p-type silicon-germanium as the wider bandgap material in the emitter and collector regions 260, 262 as shown, wherein the extrinsic base 202 is n-type silicon, n-type germanium or n-type silicon-germanium. The first silicon passivation region 186 and the second silicon passivation region 198 can be n type silicon, and the germanium region 166 can be n-type germanium.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

The invention claimed is:

1. A semiconductor structure comprising a bipolar junction transistor, wherein the bipolar junction transistor comprises:
   a first silicon passivation layer on an insulator layer including a first silicon base region, a first silicon emitter region in contact with the first silicon base region, and a first silicon collector region in contact with the first silicon base region, wherein the first silicon base region comprises dopants of a first conductivity type, said the first silicon collector and emitter regions comprise dopants having an opposite sign to the first conductivity;
   a germanium layer overlying and in contact with the first silicon passivation layer, the germanium layer including a germanium base region comprising dopants of the first conductivity type, and germanium collector and emitter regions in contact with the germanium base region comprising dopants having the opposite sign to the first conductivity; and
   an extrinsic base region comprising dopants of the first conductivity type in contact with the germanium base region.

2. The semiconductor structure of claim 1, wherein the first silicon passivation layer has a thickness less than 5 nanometers.

3. The semiconductor structure of claim 1, wherein the first silicon passivation layer is crystalline.

4. The semiconductor structure of claim 1, further comprising epitaxially grown wide bandgap materials in place of the germanium collector and emitter regions, wherein the wide bandgap materials comprise dopants having an opposite sign to the first conductivity, and wherein the first silicon emitter and collector regions comprise dopants of the second conductivity type.

5. The semiconductor structure of claim 4, wherein the wide bandgap materials comprise doped silicon or doped silicon-germanium having an opposite sign to the first conductivity.

6. A semiconductor structure comprising a bipolar junction transistor, wherein the bipolar junction transistor comprises:
   a first silicon passivation layer on an insulator layer including a silicon base region, a silicon emitter region in contact with said silicon base region, and a silicon collector region in contact with said silicon base region, wherein the silicon base region comprises dopants of a first conductivity type, said silicon collector and emitter regions comprise dopants having an opposite sign to the dopants of the first conductivity;
   a germanium layer overlying and in contact with the first silicon passivation layer, the germanium layer including a germanium base region comprising dopants of the first conductivity type, germanium collector and emitter regions in contact with said germanium base region and comprising dopants having the opposite sign to the dopants of the first conductivity;
   a second silicon passivation layer on the germanium layer including a second silicon base region, a second silicon emitter region in contact with the second silicon base region, and a second silicon collector region in contact with the second silicon base region, wherein the second silicon base region comprises dopants of a first conductivity type, and the silicon collector and emitter regions comprise dopants having an opposite sign to the dopants of the first conductivity; and
   an extrinsic base region in contact with the second silicon base region.

7. The semiconductor structure of claim 6, wherein the first and second passivation layers have a thickness less than 5 nanometers.

8. The semiconductor structure of claim 6, wherein the first and second silicon passivation layers are crystalline.

9. The semiconductor structure of claim 6, further comprising epitaxially grown wide bandgap materials in place of the second silicon collector and second silicon emitter regions, and the germanium collector and emitter regions, wherein the wide bandgap materials comprise dopants having an opposite sign to the first conductivity, and wherein the first silicon emitter and collector regions comprise dopants of the second conductivity type.

10. The semiconductor structure of claim 9, wherein the wide bandgap materials comprise doped silicon or doped silicon-germanium having an opposite sign to the first conductivity.

* * * * *